(12) United States Patent
Fujita (10) Patent No.: US 6,582,504 B1
(45) Date of Patent: Jun. 24, 2003

(54) COATING LIQUID FOR FORMING ORGANIC EL ELEMENT

(75) Inventor: Yoshimasa Fujita, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 54 days.

(21) Appl. No.: 09/716,470

(22) Filed: Nov. 21, 2000

(30) Foreign Application Priority Data

Nov. 24, 1999 (JP) ............................................. 11-332276
Nov. 24, 1999 (JP) ............................................. 11-332277

(51) Int. Cl.$^7$ ....................... C09K 11/06; H01L 29/772; C08K 5/053; C08K 5/01; C08K 5/32
(52) U.S. Cl. ............. 106/311; 252/301.16; 252/301.35; 257/215
(58) Field of Search ..................... 106/311; 252/301.16, 252/301.35; 257/215

(56) References Cited

U.S. PATENT DOCUMENTS 5,652,067 A   7/1997   Ito et al.
5,968,675 A   10/1999   Tamano et al.
6,372,154 B1 *   4/2002   Li ........................... 106/31.15

FOREIGN PATENT DOCUMENTS

| EP | 0 954 205 | | 11/1999 |
|---|---|---|---|
| EP | 1 081 557 | | 3/2001 |
| EP | 1083775 | * | 3/2001 |
| EP | 1122793 | * | 8/2001 |
| JP | 3-269995 | | 12/1991 |
| JP | 9-7768 | | 1/1997 |
| JP | 10-12377 | | 1/1998 |
| JP | 10-77467 | | 3/1998 |
| JP | 11-158426 | * | 6/1999 |
| JP | 11-273859 | | 10/1999 |
| WO | WO 94/20589 | | 9/1994 |
| WO | WO 98/33863 | | 8/1998 |
| WO | WO 99/54385 | | 10/1999 |
| WO | WO 01/16251 | * | 3/2001 |
| WO | WO 01/81012 | * | 11/2001 |

OTHER PUBLICATIONS

"Dual–Color Polymer Light–Emitting Pixels Processed by Hybrid Inkjet Printing", Chang et al., Applied Physics Letters, vol. 73, No. 18, pp. 2561–2563 (1998).
"Tetraspore is Required for Male Meiotic Cytokines in Arabidopsis", Spielman et al., pp. 2645–2657 (1997).
"Dielectric Constant Study of Liquid Mixtures of Strongly and Weakly Polar Liquids in Benzene", Adgaonkar et al., Actr Ciencia Indica, vol. 12 (P), No. 4, 121, pp. 132–137 (1986).
"Experimental Solid–Liquid Equilibria of Binary Mixtures of Organic Compounds", Proust et al., Fluid Phase Equilibria, 29, pp. 265–272 (1986).
"Ultrasonic Velocity in Binary Liquid Mixtures: m–Xylene, o–Xylene, CCl$_4$ Toluene in Nitrobenzene", Jajoo et al, Indian Journal of Pure & Applied Physics vol. 21, pp. 65–66 (1983).
"Organic Electroluminescent Device Luminescent Layer Contain Polymer Umbelliferyl Polymethacrylate"XP–002224027 (1992).
"Emergent Stem Correction for Liquid–In–Glass Thermometers", XP–002223324, pp. 192–193 of "CRC Handbook of Chemistry and Phystics 64$^{th}$Edition 1983–1984"(1983).

* cited by examiner

*Primary Examiner*—David Brunsman
(74) *Attorney, Agent, or Firm*—Nixon & Vanderhye P.C.

(57) ABSTRACT

A coating liquid for forming an organic layer of an organic EL element by a printing method, comprising at least one organic solvent showing a vapor pressure of 500 Pa or less at a temperature for forming the organic layer, an organic EL element formed by using the coating liquid and a method of manufacturing the same.

10 Claims, 11 Drawing Sheets

COATING LIQUID FOR FORMING ORGANIC EL ELEMENT

CROSS-REFERENCES TO RELATED APPLICATIONS

This application is related to Japanese applications Nos. Hei 11 (1999)-332277 and Hei 11 (1999)-332276, both filed on Nov. 24, 1999 whose priorities are claimed under 35 USC §119, the disclosures of which are incorporated by reference in their entirety.

BACKGROUND OF THE INVENTION

1. Field of the Invention

The present invention relates to a coating liquid for forming an organic electroluminescence (EL) element which allows full-color display, the organic EL element and a manufacture method of the same.

2. Description of Related Art

According to a highly advanced technology in recent years, display devices reduced in size, power consumption and weight have been demanded and attention has been paid to high luminance and low-voltage-drive organic electroluminescence (EL) display devices. As a result of recent research and development, organic EL elements made of organic materials exhibit marked improvement in light emitting efficiency and practical application thereof has been started. In view of manufacture of such organic EL display devices, polymer materials have been used in expectation of reduced production costs since they can be formed into films by coating. Accordingly, a method for patterning such polymer materials into light emitting layers in order to obtain organic EL color display devices has currently been researched.

There is a close relationship between a film forming process and a patterning process. A dry process and a wet process have been employed for the film formation, among which the wet process takes a merit of easier film formation. Examples of the patterning method used in the wet process include, for example, electrodeposition (Japanese Unexamined Patent Publication No. Hei 9 (1997)-7768), ink jet technique (Japanese Unexamined Patent Publication No. Hei 10 (1998)-12377), and printing method (Japanese Unexamined Patent Publications Nos. Hei 3 (1991)- 269995, Hei 10 (1998)-77467 and Hei 11 (1999)-273859).

However, in the electrodeposition, a film of favorable quality cannot be formed and usable materials are limited. The ink jet technique cannot form a film of favorable surface configuration. A film of favorable quality and surface configuration can be formed by the printing method.

In the case where a thin film of 1 $\mu$m or less as required for the organic EL element is aimed, it is necessary to apply the film much thinner in a wet state than in a normal printing.

However, where solvents such as chloroform, methylene chloride, dichloroethane, tetrahydrofuran, toluene and xylene described in Examples of the above-mentioned Japanese Unexamined Patent Publication No. Hei 3 (1991)-269995 are used in a coating liquid and applied thin in the wet state, the coating liquid is dried on a roller or a transfer substrate. Accordingly, it is impossible to form a desired film on a substrate by the printing method. Further, the above-mentioned Japanese Unexamined Patent Publications Nos. Hei 10 (1998)-77467 and Hei 11 (1999)-273859 use a micro gravure coater to obtain the thin film of 1 $\mu$m or less, in which the roller for applying the coating liquid to the substrate rotates in the direction opposite to that of the substrate movement. As a result, a patterned film cannot be obtained and color display by light emitting layers of different colors cannot be realized. Even if the thin film is obtained with the coating liquid of reduced concentration, a metal mesh used for screen printing leaves its mark, which may cause short circuit or irregular light emission.

In the case of forming a full color light emitting element with the different colored light emitting layers by the printing method as described above, it is preferred to provide ribs between pixels of the light emitting layers to prevent mixing of the light emitting layers.

Figure 16:
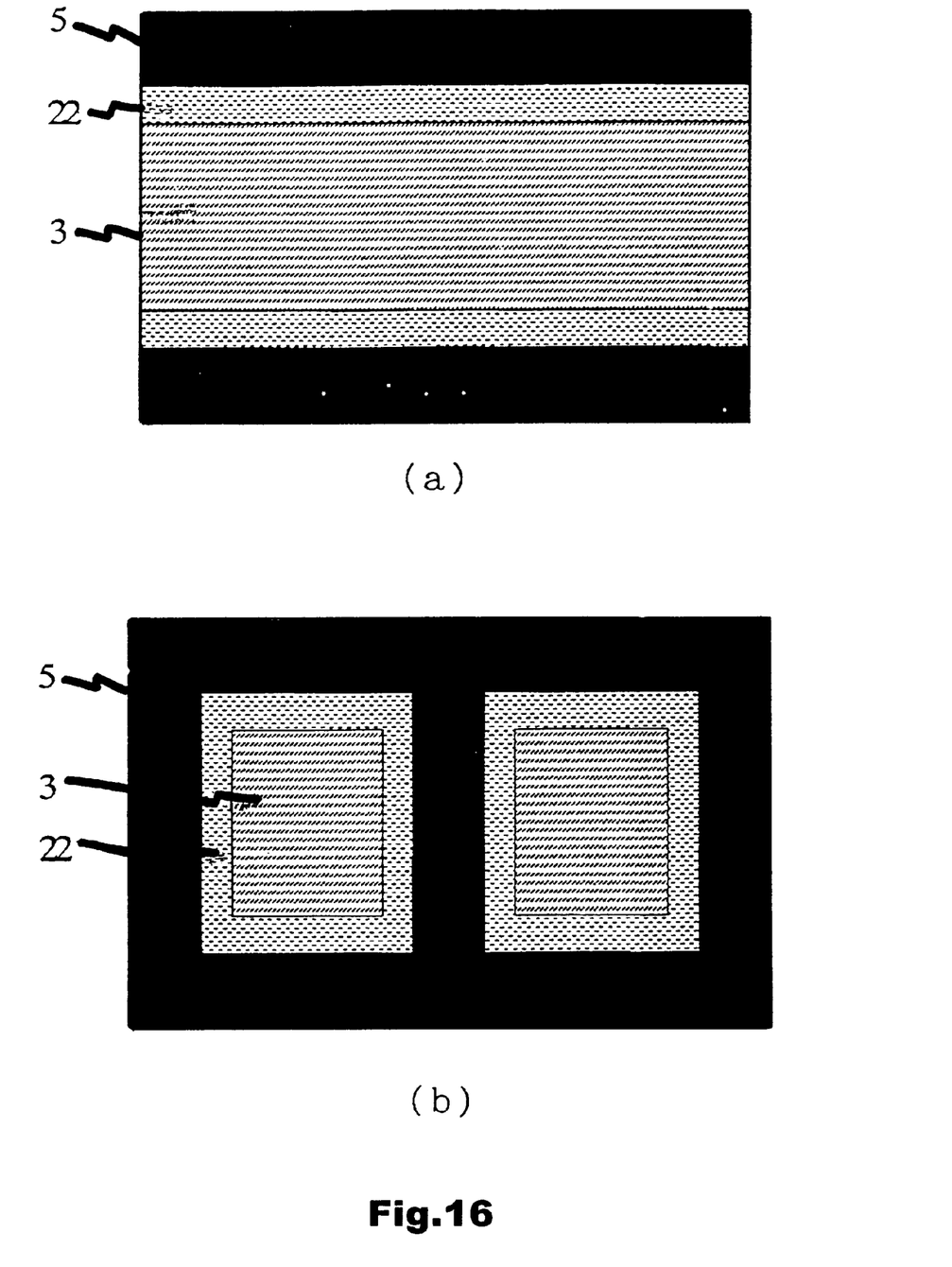
FIGS. 16(a) and 16(b) are schematic plan views partially illustrating an organic EL element according to the prior art.

However, where the coating liquid is applied by the printing method onto the substrate provided with the ribs, the coating liquid is not applied to the neighborhood of the ribs, that is, portions without an organic electroluminescence (EL) layer are resulted. Where electrodes are formed on the organic EL layers and voltage is applied, short circuit between the electrodes occurs at the portion without the organic EL layer. Therefore the element does not emit the light. FIGS. 16($a$) and 16($b$) show the portion in which the organic EL layer is not formed due to the existence of the ribs. Reference numeral 5 denotes the rib, 3 the organic EL layer and 22 the portion without the organic EL layer. Where the ribs are arranged in stripes as shown in FIG. 16($a$), the portions 22 without the organic EL layers are formed in stripes along the ribs. Where the ribs are formed into the enclosure shape as shown in FIG. 16($b$), the portions without the organic EL layers are generated in the enclosure shape along the inside of the ribs.

Figure 17:
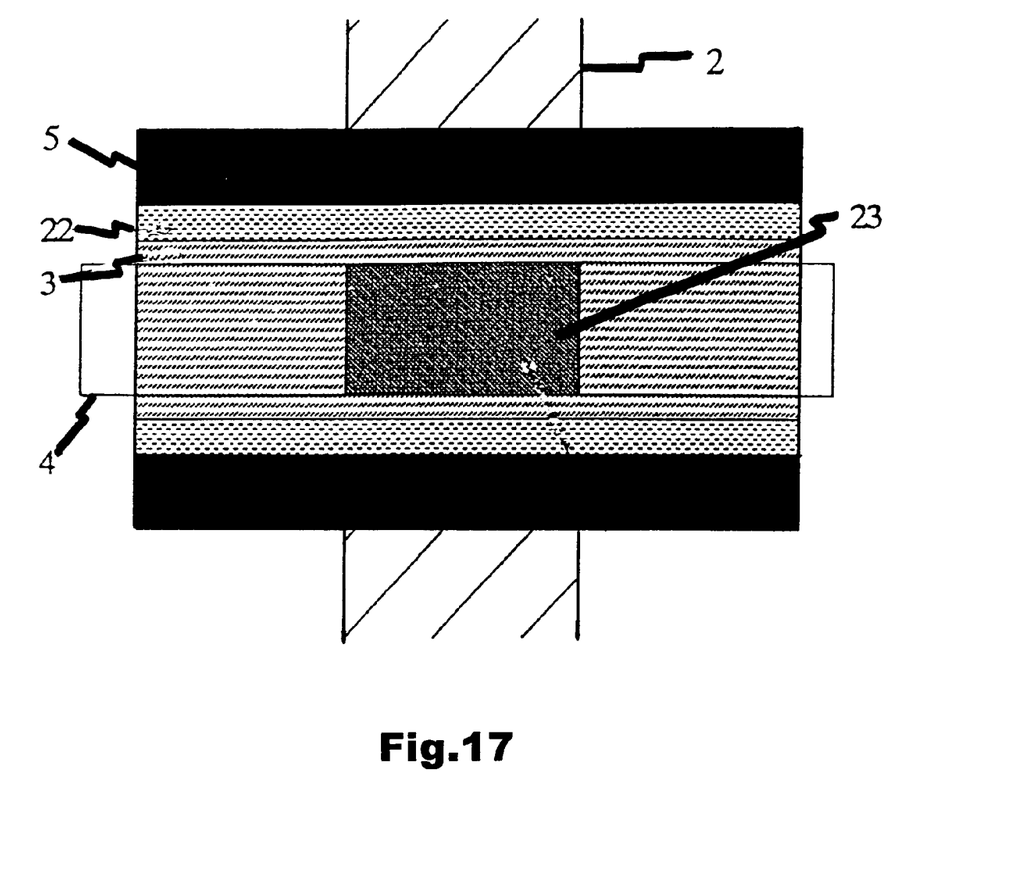
FIG. 17 is a schematic plan view partially illustrating a light emitting region of the organic EL element according to the prior art.

If narrow electrodes are formed so as not to overlap with the portions to which the coating liquid is not applied to prevent the short circuit, an area shared by the light emitting region in the organic EL element is reduced. FIG. 17 shows an example where a narrow second electrode 4 is formed on the organic EL layer 3. When the second electrode 4 is configured so as not to overlap with the portions without the organic EL layers, an intersectional portion of a first electrode 2 and the second electrode 4 serves as a light emitting region 23. Thus, the light emitting region becomes smaller and a percentage of area shared by the light emitting region in the organic EL element is reduced.

SUMMARY OF THE INVENTION

The present invention has been achieved in view of the above drawbacks. The inventor of the invention has found that the drying of the coating liquid during the printing step is closely related to the vapor pressure of the solvent used and that the drying can be avoided by adding at least one solvent of low vapor pressure.

Further, the inventor has found that the mixing of the light emitting layers formed by letterpress printing can be prevented by providing the ribs. He has also found that the generation of the portions to which the coating liquid is not applied is effectively avoided by combining the letterpress printing with spin coating, bar coating, dip coating, discharge coating or vapor deposition.

According to the present invention, provided is a coating liquid for forming an organic layer of an organic EL element by a printing method, comprising at least one organic solvent showing a vapor pressure of 500 Pa or less at a temperature for forming the organic layer.

The present invention further provides an organic EL element in which at least one organic layer comprising the organic EL layer is formed by using the coating liquid for forming the organic EL layer described above.

Still according to the present invention, provided is a method for forming an organic EL element comprising a substrate, an organic EL layer constructed of a single organic layer or plural organic layers and a pair of electrodes sandwiching the organic EL layer, wherein at least one organic layer of the organic EL layer is formed by a printing method utilizing the coating liquid for forming the organic EL layer described above and a printer.

These and other objects of the present application will become more readily apparent from the detailed description given hereinafter. However, it should be understood that the detailed description and specific examples, while indicating preferred embodiments of the invention, are given by way of illustration only, since various changes. and modifications within the spirit and scope of the invention will become apparent to those skilled in the art from this detailed description.

DESCRIPTION OF THE PREFERRED EMBODIMENTS

Hereinafter, the preferred embodiments of the present invention will be described with reference to the figures.

Figure 1:
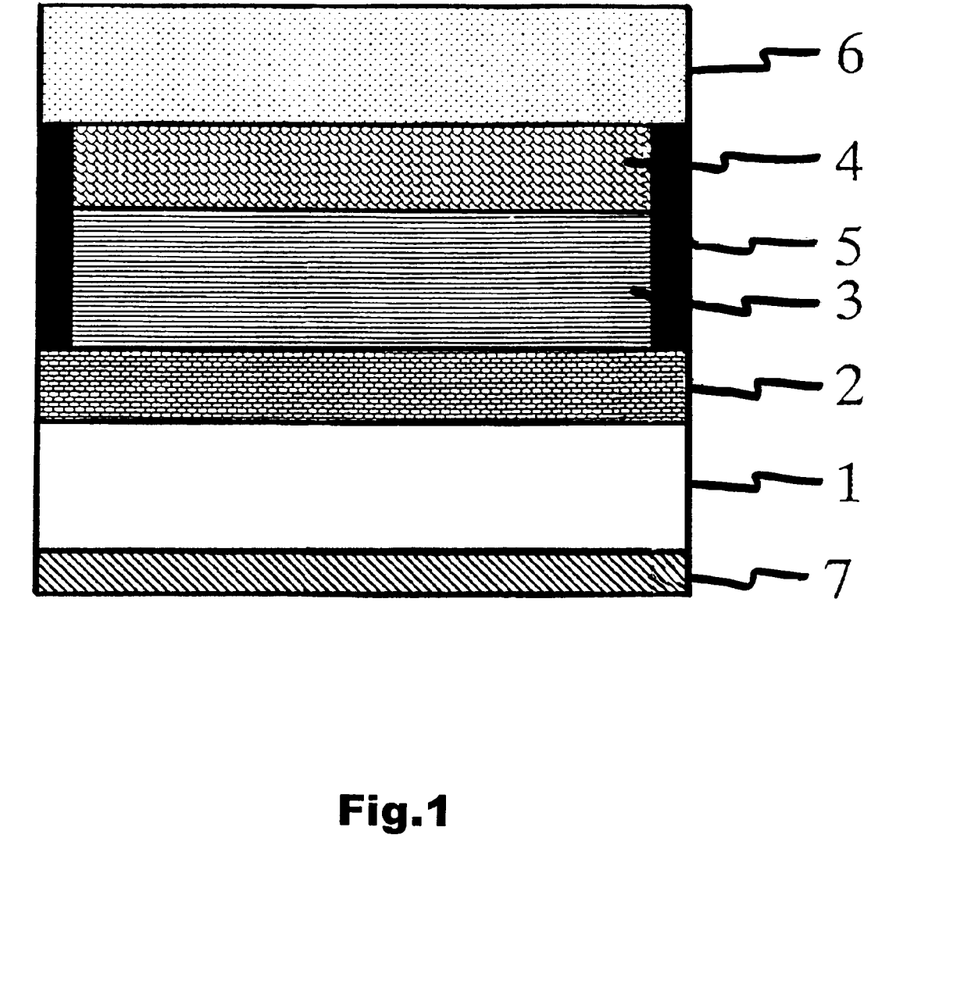
FIG. 1 is a schematic sectional view illustrating an organic EL element of the present invention.

As shown in FIG. 1, an organic EL element comprises at least a first electrode 2, an organic EL layer 3 and a second electrode 4 formed in this order on a substrate 1. Ribs 5 are provided on the sidewalls of the organic EL layer 3 and the second electrode 4. In view of contrast, it is preferred to provide a polarizing plate 7 on the outer side of the substrate 1. Further, in view of reliability, it is preferred to provide a sealing film or a sealing substrate 6 on the second electrode 4. Organic solvents to be described in the present invention are used for forming the organic EL layer 3.

Figure 2:
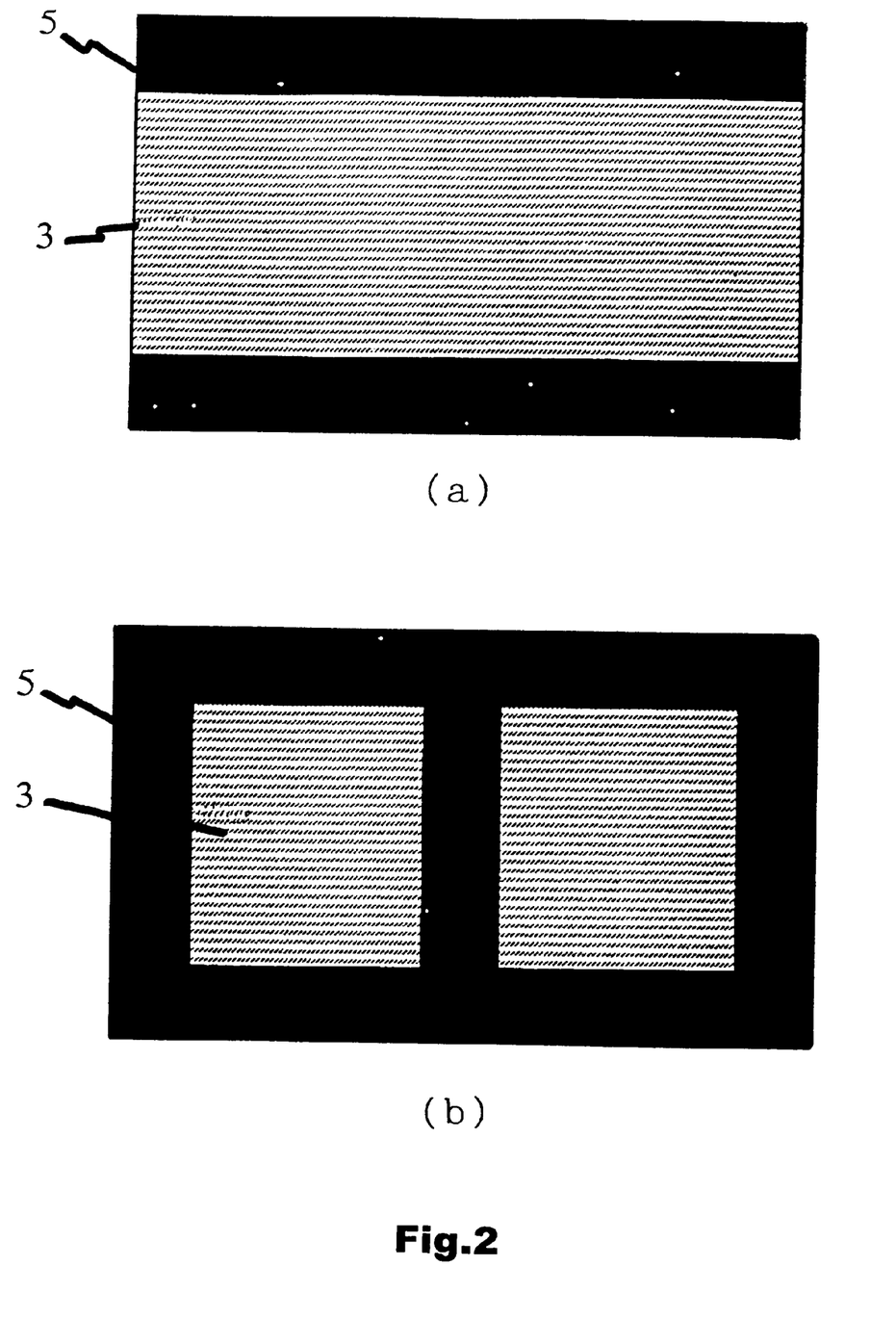
FIGS. 2(a) and 2(b) are schematic plan views partially illustrating the organic EL element of the present invention.

FIGS. 2(a) and 2(b) each shows the organic EL element formed in accordance with the present invention. Reference numeral 5 denotes the ribs, and 3 denotes the organic EL layers. As seen in FIGS. 2(a) and 2(b), the organic EL layer 3 is formed to contact the ribs 5 without any gap therebetween, whether the ribs are arranged in the shape of stripes or enclosures.

Figure 3:
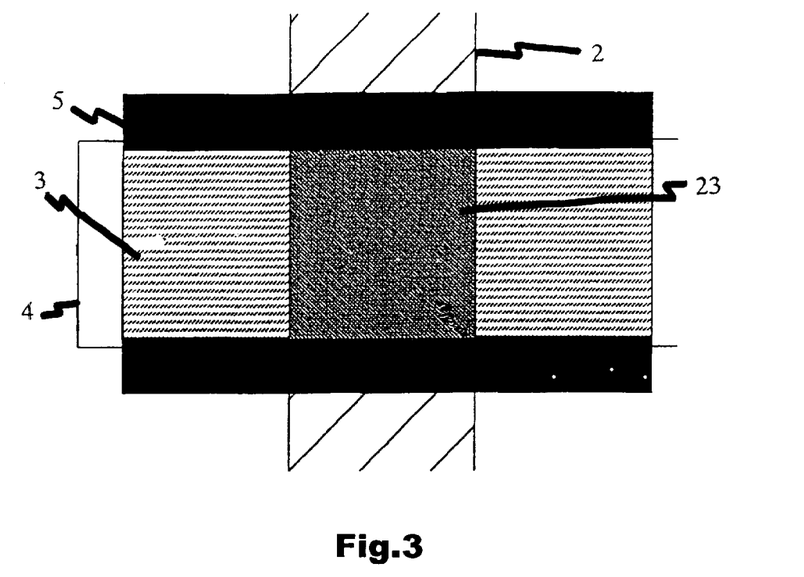
FIG. 3 is a schematic plan view partially illustrating a light emitting region of the organic EL element of the present invention.

FIG. 3 shows the first and second electrodes provided to the organic EL layer which has been formed in accordance with the method of the present invention. Since the organic EL layer 3 has been formed in contact with the ribs 5, the light emitting region can be formed greater as compared with the prior art, which increases the percentage of the light emitting region in the organic EL element.

Examples of the substrate 1 include inorganic material substrates such as of quartz, glass and the like, resin substrates such as of polyethylene terephthalate, polyethersulfone, polyimide and the like, but the present invention is not limited thereto.

The organic EL layer 3 is constructed of at least one organic light emitting layer. The construction thereof may be a single layer of the light emitting layer, or a multilayer of a charge-transporting layer and the organic light emitting layer. The charge-transporting layer and the organic light emitting layer may have a multilayer construction, respectively. If necessary, a buffer layer may be provided between the light emitting layer and the electrode.

It is required that at least one layer of the organic EL layer 3 is formed by the printing method using a coating liquid for forming the organic EL element of the present invention. Other layers of the organic EL layer 3 may be formed by the method of the present invention or prior art methods (e.g., dry process by vacuum vapor deposition, or wet process by spin coating, bar coating, dip coating, discharge coating, spray coating, ink jet coating and the like). Among these, the vapor deposition, spin coating, bar coating, dip coating and discharge coating are preferable.

The spin coating is a method for rotating the substrate to form the coating liquid into a thin film utilizing centrifugal force, while controlling the rotation. The bar coating (doctor blade method) is a method for moving a bar or a blade with a vessel containing the coating liquid above the substrate to form the thin film while controlling a gap between the bar or the blade and the substrate. The dip coating is a method for dipping the substrate in a bath containing the coating liquid to obtain the thin film. The amount of the coating liquid remaining onto the substrate is adjusted by controlling the viscosity of the coating liquid. The discharge coating is a method for discharging the coating liquid onto the substrate to obtain the thin film while controlling the amount of the coating liquid per unit area.

Next, the organic EL coating liquid used in the printing method according to the present invention will be explained. The organic EL coating liquid used in the present invention is roughly classified into a coating liquid for forming a light emitting layer and that for forming a charge-transporting layer.

The coating liquid for forming the light emitting layer (hereinafter merely referred to as the coating liquid) may be prepared by dissolving or dispersing: a material containing a light emitting low molecular material; a light emitting polymer material; a precursor of the light emitting polymer material that are known for forming the organic EL elements; or a mixture of the light emitting low molecular material and a polymer material into a solvent containing at least one organic solvent having a vapor pressure of 500 Pa or less at a temperature during the film formation by the printing method.

Examples of the known light emitting low molecular material used for forming the organic EL element include, for example, triphenylbutadiene, coumarin, Nile red, oxadiazole derivatives and the like, but they are not limitative.

Examples of the known light emitting polymer material used for forming the organic EL element include poly(2-decyloxy-1,4-phenylene) (DO-PPP), poly[2,5-bis[2-(N,N,N-triethylammonium)ethoxy]-1,4-phenylene-alto-1,4-phenylene]dibromide (PPP-NEt$_3$⁺), poly[2-(2'-ethylhexyloxy)-5-methoxy- 1,4-phenylenevinylene](MEH-PPV), poly(5-methoxy-(2-propanoxysulfonide)-1,4-phenylenevinylene) (MPS-PPV), poly[2,5-bis(hexyloxy-1,4-phenylene)-(1-cyanovinylene)](CN-PPV), poly[2-(2'-ethylhexyloxy)-5-methoxy-1,4-phenylene-(1-cyanovinylene)](MEH-CN-PPV) and poly(dioctylfluorene) (PDF), for example. However, the present invention is not limited thereto.

Examples of the known precursor of the light emitting polymer material for forming the organic EL element include, for example, a precursor of poly(p-phenylene) (Pre-PPP), a precursor of poly(p-phenylenevinylene) (Pre-PPV), a precursor of poly(p-naphthalenevinylene) (Pre-PNV) and the like. However, these are not limitative.

The mixture of the light emitting low molecular material used for forming the organic EL element and the polymer material may be consisted of the above-mentioned light emitting low molecular materials and known polymer materials, e.g., polycarbonate (PC), polymethylmethacrylate (PMMA), polycarbazole (PVCz) and the like. However, the present invention is not limited thereto.

A coating liquid prepared by dissolving or dispersing the above-mentioned light emitting material in a solvent containing at least one organic solvent having a vapor pressure of 500 Pa or less at a temperature for the film formation by the printing method can be used. The vapor pressure is preferably 250 Pa or less in view of surface properties of the film. The organic solvent having the vapor pressure of 500 Pa or less at a temperature for the film formation by the printing method may be, for example, ethylene glycol, propylene glycol, triethylene glycol, ethylene glycol monomethyl ether, ethylene glycol monoethyl ether, triethylene glycol monomethyl ether, triethylene glycol monoethyl ether, glycerin, N,N-dimethylformamide, N-methyl-2-pyrrolidone, cyclohexanone, 1-propanol, octan, nonan, decan, xylene, diethylbenzene, (1,2,3-; 1,2,4-; 1,3,5-) trimethylbenzene, nitrobenzene, o-xylene, isopropylbenzene and the like. Among these solvents, one or more organic solvents selected from diethylbenzene, (1,2,3-; 1,2,4- or 1,3,5-)trimethylbenzene, (1,2,3-; 1,2,4- or 1,3,5-)triethylbenzene, isopropylbenzene and nitrobenzene are preferable.

Further, a mixed solvent of two or more organic solvents can be used. The mixed solvent contains 50wt % or more of an organic solvent having a vapor pressure of 500 Pa or less at a temperature for the film formation by the printing method. The vapor pressure of a solvent to be mixed with this organic solvent is not particularly limited. Examples of the mixed solvent include a mixture of o-xylene and nitrobenzene in the ratio of 4:6, a mixture of methanol and ethylene glycol in the ratio of 4:6 and the like.

The coating liquid may be added with additives or leveling agents for adjusting the viscosity of the coating liquid. Known hole-transporting materials for the organic EL element or an organic photoconductor, e.g., N,N-bis-(3-methylphenyl)-N,N'-bis-(phenyl)-benzidine (TPD) and N,N'-di(naphthalene-1-yl)-N,N'-diphenyl-benzidine (NPD), which are not limitative, may also be added to the coating liquid. Alternatively, known electron-transporting materials for the organic EL element, e.g., 3-(4-biphenyl-yl)-4-phenylene-5-t-butylphenyl-1,2,4-triazole (TAZ), tris(8-hydroxynate)aluminum (Alq$_3$) and the like, which are not limitative, or dopants such as acceptors and donors may be added to the coating liquid.

The coating liquid for forming the charge-transporting layer can be prepared by dissolving or dispersing: a charge-transporting low molecular material; a charge-transporting polymer material; a precursor of the charge-transporting polymer material known for forming the organic EL element or the organic photoconductor; or a mixture of the known charge-transporting low molecular material and a polymer material into a solvent containing at least one organic solvent having a vapor pressure of 500 Pa or less at a temperature for the film formation by the printing method.

Examples of the charge-transporting low molecular materials known for forming the organic EL element or the organic photoconductor include TPD, NPD, oxadiazole derivatives and the like, which are not limitative.

Examples of the charge-transporting polymer material known for forming the organic EL element or the organic photoconductor include, for example, polyaniline (PANI), 3,4-polyethylenedioxythiophene (PEDOT), polycarbazole (PVCz), poly(triphenylamine derivatives) (poly-TPD), poly (oxadiazole derivatives) (Poly-OXZ) and the like. However, the present invention is not limited thereto.

Examples of the precursor of the known charge-transporting polymer materials for forming the organic EL element or the organic photoconductor include, for example, Pre-PPV, Pre-PNV and the like, which are not limitative.

Example of the mixture of the known charge-transporting low molecular material for the organic EL element or the organic photoconductor and the known polymer material may be consisted of the above-mentioned charge-transporting low molecular material and a known polymer material (e.g., PC, PMMA, PVCz and the like; but the invention is not limited thereto).

A coating liquid prepared by dissolving or dispersing the above-mentioned charge-transporting material into a solvent containing at least one organic solvent having a vapor pressure of 500 Pa or less at a temperature for the film formation by the printing method can be used as the coating liquid for forming the charge-transporting layer. As the solvent, the solvents used for preparing the coating liquid for forming the light emitting layer can be used. If necessary, the coating liquid may be added with leveling agents for adjusting the viscosity, dopants such as acceptors, donors and the like.

Known light emitting materials for the organic EL element can be used in the prior art technique. The organic light emitting layer may be constructed of the above-mentioned organic light emitting materials only, or may contain additives and the like.

Known charge-transporting materials for the organic EL element and the organic photoconductor can be used in the prior art technique. The charge-transporting layer may be constructed of the above-mentioned organic light emitting materials only, or may contain additives and the like. However, the present invention is not limited thereto.

For forming an organic EL display constructed of a multilayer film, it is preferred to use a coating liquid containing an organic solvent which will not dissolve a previously formed underlying layer when applied thereon so as to prevent the mixing of the layer materials contacting each other.

In the organic EL element, where the substrate 1 and the first electrode 2 are transparent, the light emitted from the organic EL layer 3 is transmitted from the substrate 1. Accordingly, it is preferred to form the second electrode with a reflective material or a reflective film is provided on the second electrode 4 to enhance the light emission efficiency. It may also be possible to form the second electrode 4 with a transparent material to transmit the light emitted from the organic EL layer 3 out of the second electrode 4. In this case, it is preferred to form the first electrode 2 with a reflective material or a reflective film is provided between the first electrode 2 and the substrate 1.

The transparent material may be CuI, ITO, IDIXO, $SnO_2$, ZnO and the like. The reflective material may be metals such as aluminum and calcium, alloys such as of magnesium/silver and lithium/aluminum, layered metal films such as of calcium/silver and magnesium/silver, layered films of insulator and metal such as lithium fluoride/aluminum, but they are not limitative.

These materials can be formed into a film on the substrate or the organic EL layer by a dry process such as sputtering, EB evaporation, resistance heating evaporation or the like, but they are not limitative. It is also possible to disperse the above materials into a binder resin to form into a film by a wet process such as an ink jet technique. However, the invention is not limited thereto.

Then, the organic EL display constructed of a plurality of organic EL elements will be explained.

Figure 4:
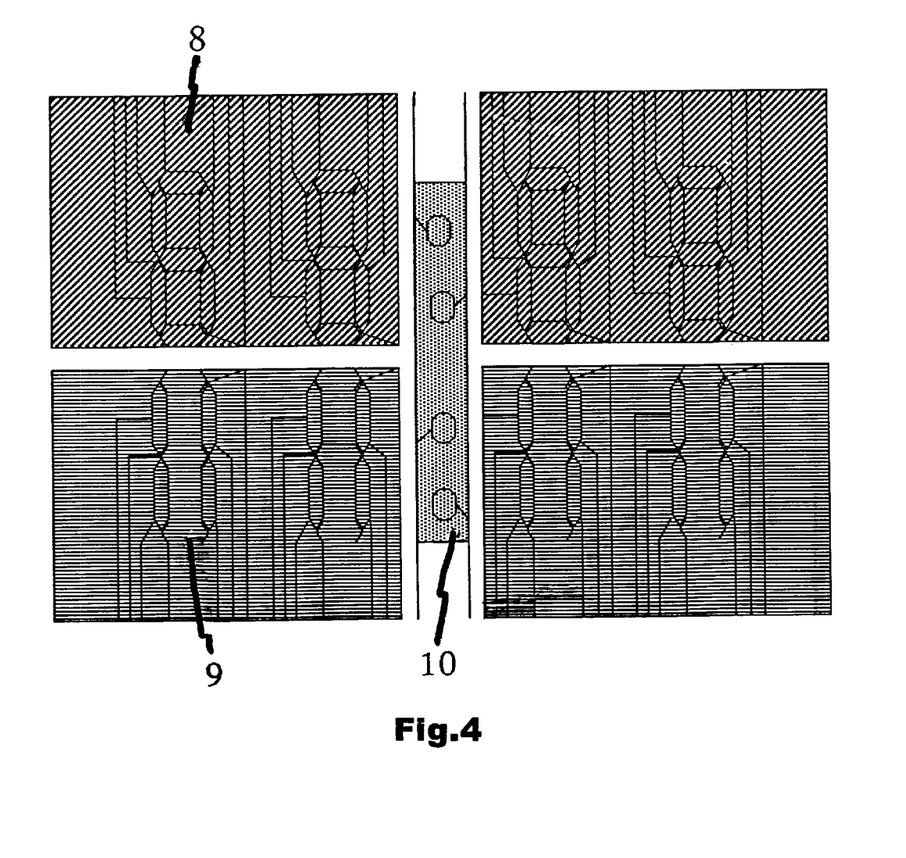
FIG. 4 is a schematic plan view partially illustrating an arrangement of light emitting layers in an organic EL display of the present invention.
Figure 5:
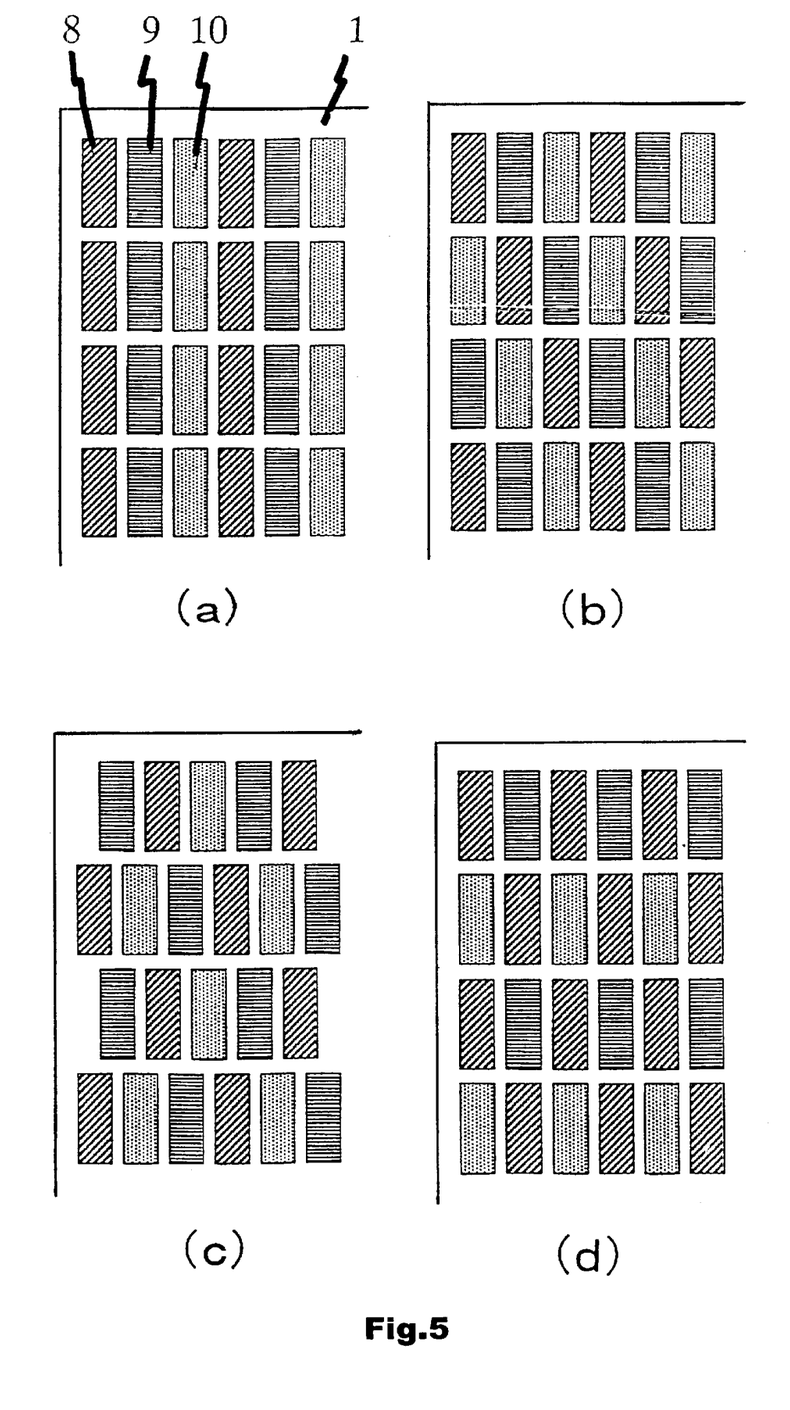
FIGS. 5(a) to 5(d) are schematic plan views partially illustrating an arrangement of light emitting pixels in the organic EL display of the present invention.

First, an arrangement of light emitting pixels of the organic EL display is described. The organic EL display of the present invention may be constructed of portions each emitting light of different color as shown in FIG. 4. Alternatively, the organic EL layer may be configured into matrix each comprising a red (R) light emitting pixel 8, a green (G) light emitting pixel 9 and a blue (B) light emitting pixel 10 as shown in FIG. 5(a). The pixels shown in FIG. 5(a) are arranged in line by color. In place of this arrangement, the light emitting pixels of different colors may be arranged side by side as shown in FIG. 5(b). An arrangement as shown in FIG. 5(c) is also possible. Further, as shown in FIG. 5(d), the ratios of R, G and B light emitting pixels may not necessarily be 1:1:1. The area shared by each pixel may be the same or different.

It is preferred to provide ribs between the pixels of different colors to prevent the mixing of the light emitting layers.

Figure 6:
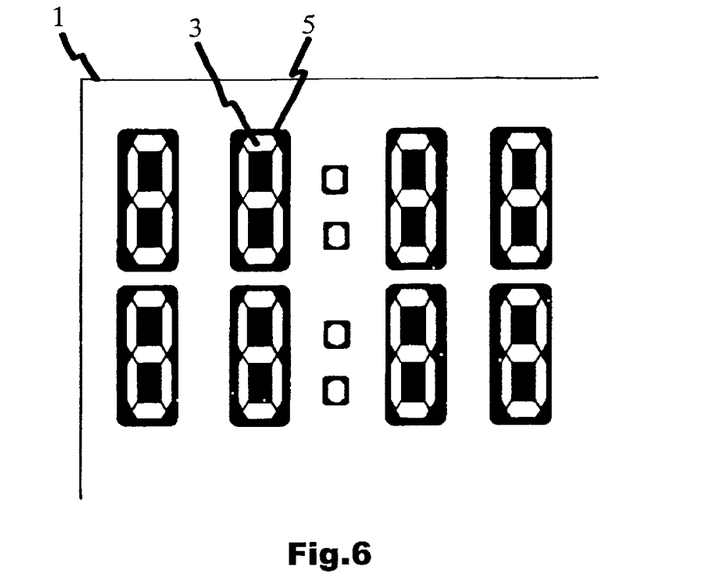
FIG. 6 is a schematic plan view partially illustrating an arrangement of ribs in the organic EL display of the present invention.
Figure 7:
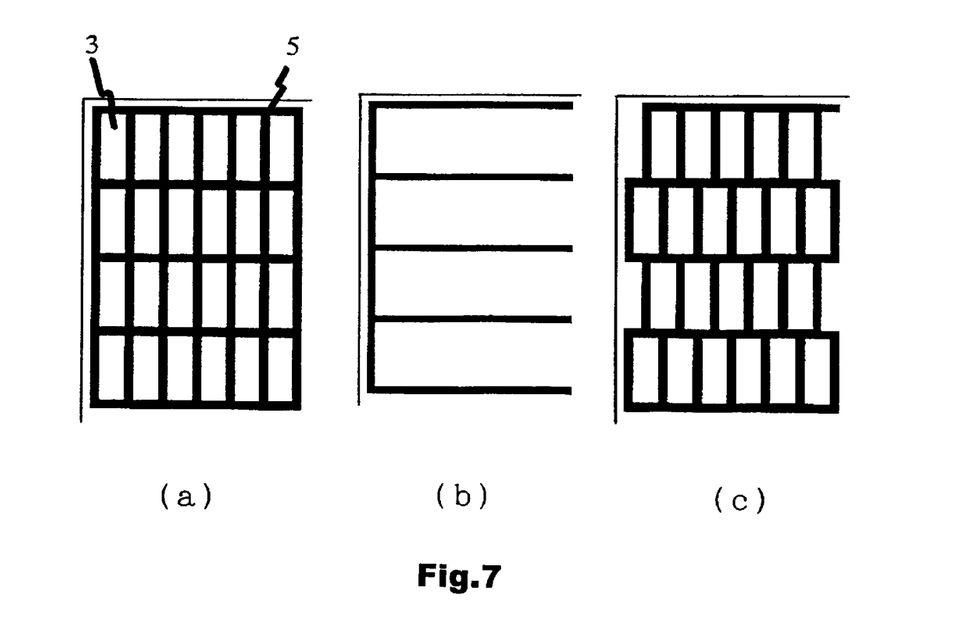
FIGS. 7(a) to 7(c) are schematic plan views partially illustrating the rib arrangement in the organic EL display of the present invention.

To the organic EL layers arranged as shown in FIG. 4, ribs 5 are provided so as to enclose the organic EL layers as shown in FIG. 6. To the organic EL layers arranged in matrix as shown in FIG. 5(a) and 5(c), the ribs are provided so as to enclose each light emitting pixel (see FIGS. 7(a) and 7(c)). Where the pixels of different colors are arranged side by side as shown in FIG. 5(b), the ribs may be provided between lines of the pixels as shown in FIG. 7(b).

The ribs may be formed of a single layer or multiple layers. Material thereof is preferably insoluble or hardly soluble to the coating liquid of the present invention. Materials for black matrix are more preferable for increasing the display quality of the organic EL display.

With the ribs each having a trapezoidal cross section having two parallel sides, one of which on the substrate being longer than the other, a portion without forming the organic EL layer after going through the printing step can be reduced.

Figure 8:
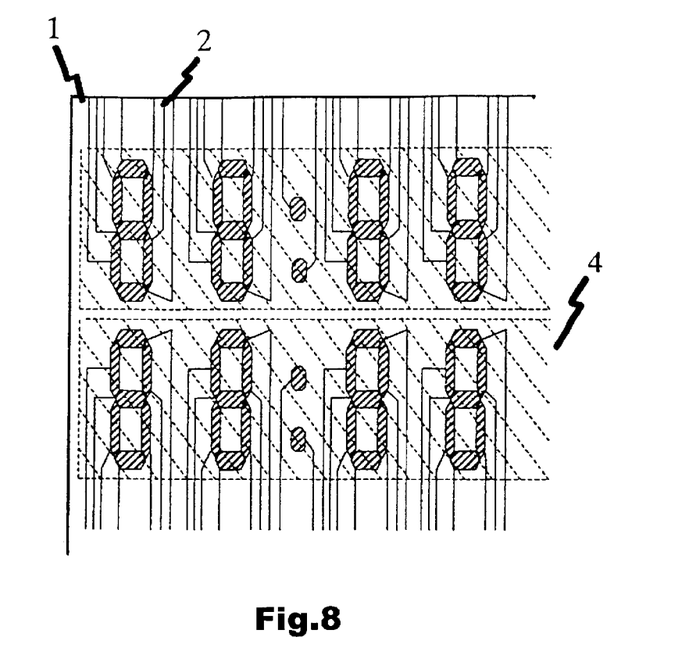
FIG. 8 is a schematic plan view partially illustrating an arrangement of electrodes in the organic EL display of the present invention.
Figure 9:
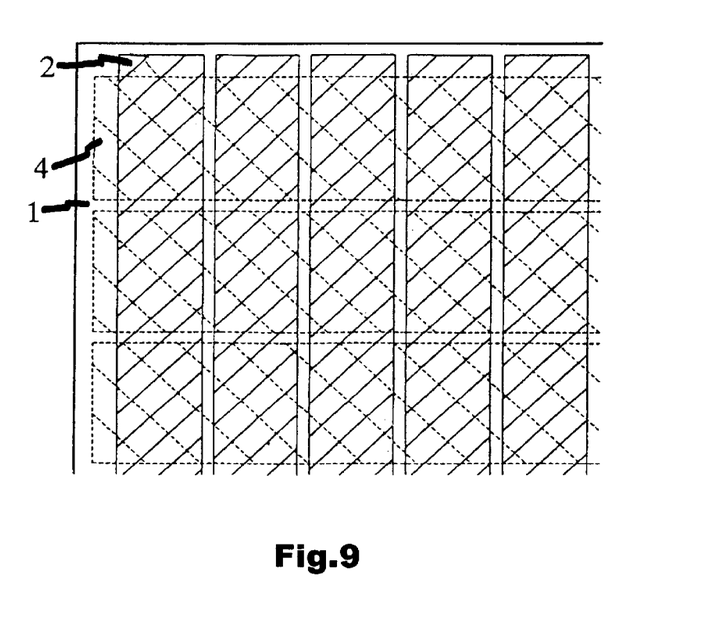
FIG. 9 is a schematic plan view partially illustrating the electrode arrangement in the organic EL display of the present invention.
Figure 10:
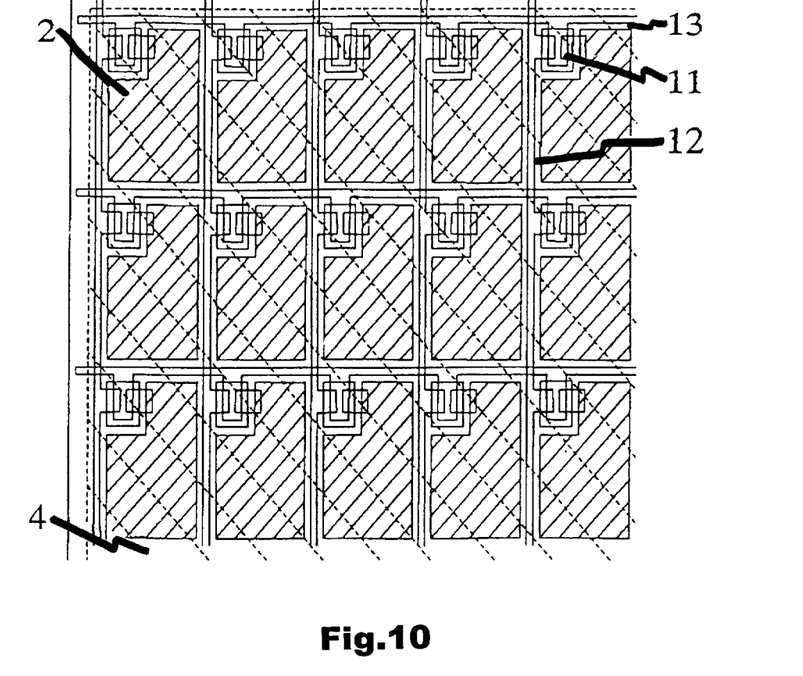
FIG. 10 is a schematic plan view partially illustrating the electrode arrangement in the organic EL display of the present invention.

Referring now to FIG. 8, connections of the first and second electrodes with respect to the pixels will be explained. At least the first electrode or the second electrode may be provided individually to each pixel. Alternatively, the first and second electrodes may be formed in the form of stripes, respectively so as to orthogonally cross each other in a portion corresponding to the organic EL layer as shown in. FIG. 9. Further, as shown in FIG. 10, the first or second electrode may be connected to a common electrode (source bus line 12, gate bus line 13) through a thin film transistor (TFT) 11. One or more TFT may correspond to one pixel. Reference numerals appear in FIGS. 8, 9 and 10 are identical to those in FIG. 1.

According to the present invention, the organic layer may be formed on the first electrode or the charge-transporting layer by forming the coating liquid into the film by the printing method. Alternatively, the charge-transporting layer may be formed on the first electrode, the charge-transporting layer or the light emitting layer.

The printing method according to,the present invention is performed by applying the coating liquid on a transfer substrate to transfer it to the substrate. Examples of the printing method include letterpress printing, intaglio printing, planograph printing, offset printing and the like, but these are not limitative. The letterpress printing, intaglio printing and planograph printing are preferred to form a uniform thin film of 1 $\mu$m or less. The letterpress printing is more preferred to form a uniform thin film of 1000 Å or less. Thus, a uniform organic EL thin film can be obtained.

Still more preferably, the organic EL thin-film is constructed of at least one layer formed by the letterpress printing and at least one layer formed by spin coating, bar coating, dip coating or discharge coating using an organic coating liquid containing at least an organic material and a solvent, or by vapor deposition using an organic material. Thus, a space near the ribs (where the organic EL thin film has not been provided by the printing method) cannot be generated, which prevents short circuit of the organic EL element without the drop of the percentage of area shared by the light emitting region.

The thickness of the organic layer may preferably be 50 to 2000 Å, more preferably, 200 to 1000 Å.

Figure 11:
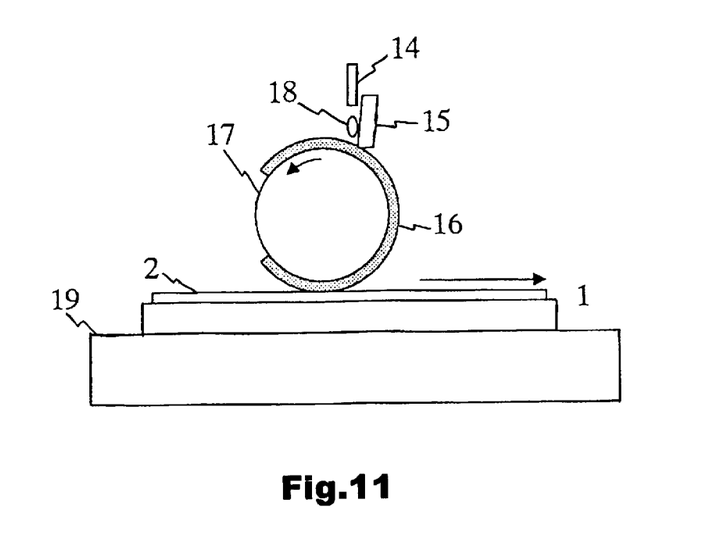
FIG. 11 is a schematic sectional view partially illustrating a printer for forming the organic EL display of the present invention.
Figure 12:
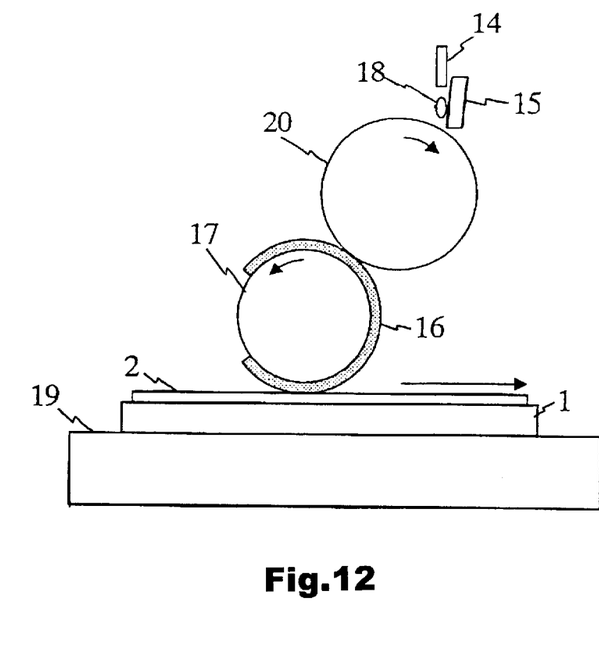
FIG. 12 is a schematic sectional view partially illustrating the printer for forming the organic EL display of the present invention.
Figure 13:
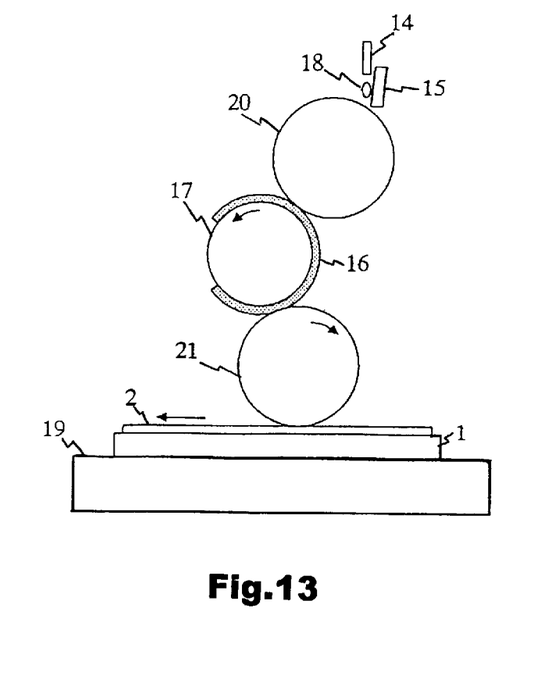
FIG. 13 is a schematic sectional view partially illustrating the printer for forming the organic EL display of the present invention.

In the construction of the printer shown in FIG. 11, a coating liquid 18 may be introduced from a coating. liquid inlet 14 through a blade 15 to be applied onto a transfer substrate 16 fixed to a roller 17 and transferred to the first electrode 2 on the substrate 1 placed on a stage 19. The construction shown in FIG. 12 is more preferred in which the coating liquid 18 is applied to a roller 20 (anilox roll) which temporarily keeps the coating liquid, and then to the transfer substrate 16 fixed to the roller 17 to be transferred to the first electrode 2. The construction shown in FIG. 13 is also possible in which the coating liquid 18 is applied to the roller 20 which temporarily keeps the coating liquid, transferred to the transfer substrate 16 fixed to the roller 17, and then again transferred to a roller 21 to transfer to the first electrode 2. An anilox roll of 200 to 600 lines/inch can be used.

Figure 14:
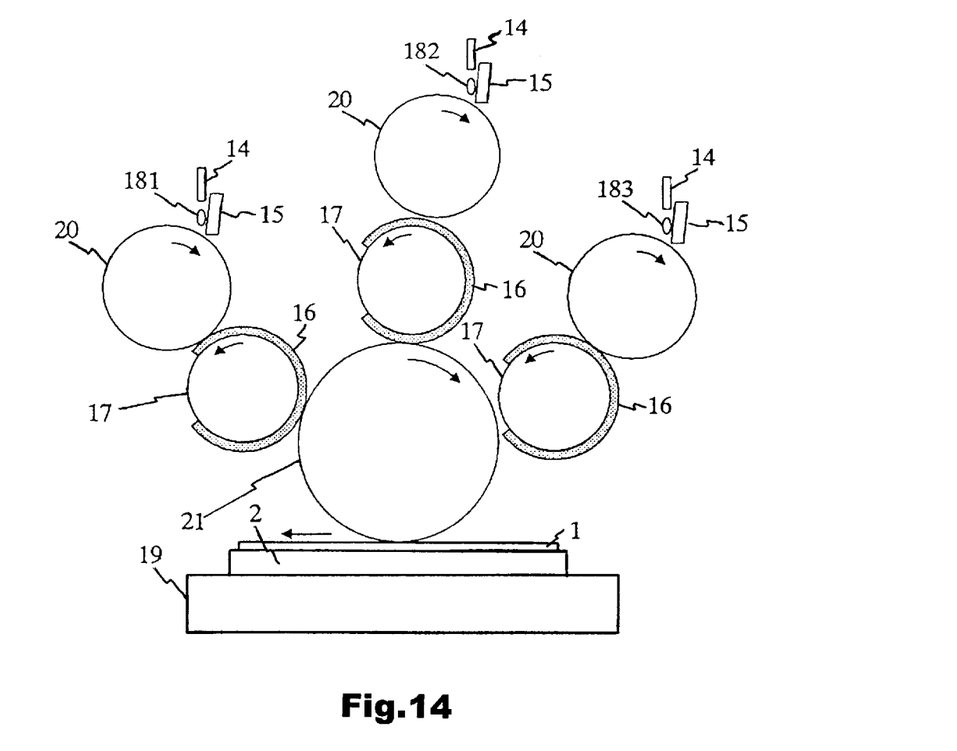
FIG. 14 is a schematic sectional view partially illustrating the printer for forming the organic EL display of the present invention.

Further, as shown in FIG. 14, coating liquids 181, 182 and 183 for forming red, green and blue light emitting layers are applied to the transfer substrates 16 through the anilox rolls 20, respectively to transfer the coating liquids of three colors to the roller 21 and then to the substrate. Thus, the light emitting layers of three different colors can be formed at one time.

The transfer substrate 16 may be formed of either metal or resin where the substrate 1 is a resin substrate. Where the substrate 1 is made of an inorganic material, the transfer substrate may be formed of resin taking damage to the substrate into consideration. The metal material may be copper and the resin material may be APR (manufactured by Asahi Chemical Industry Co. Ltd., Japan) or Fuji Trelief (manufactured by Fuji Photo Film Co. Ltd, Japan), but they are not limitative.

The transfer substrate may be patterned simply to have projections and depressions (letterpress or intaglio) or patterned to have an affinitive portion and a repellent portion with respect to the coating liquid (a flat substrate is also possible). Resin materials having a hardness of 18 to 90 (Shore D) or 33 to 70 (Shore A) can be generally used.

To satisfy the condition of the vapor pressure according to the present invention, the film may be formed at room temperature using the coating liquid containing at least an organic solvent which exhibits a vapor pressure of 500 Pa or less at room temperature. Alternatively, the printer may be placed in a thermostatic bath or a thermostatic room to perform the film formation using the coating liquid and the printer at low temperature, so that the vapor pressure of the organic solvent in the coating liquid can be limited to 500 Pa or less. Temperature for forming the film is preferably 0° C. to 30° C.

To portions where the coating liquid contacts, e.g., the roller which temporarily keeps the coating liquid, the roller for supporting the transfer substrate and the stage for fixing the substrate, a cooling system (e.g., cold water circulation system, Pertier device and the like) is provided to limit the vapor pressure of the organic solvent contained in the coating liquid to 500 Pa or less at a temperature for the film formation. The atmosphere for the printing is not particularly limited, but preferably in an inert gas taking the absorbency and the denaturation of the film into consideration.

After forming the film by the method of the present invention, the film is preferably heated to dryness to remove the remaining solvent. The atmosphere for the heating is not particularly limited but it is preferably carried out in an inert gas atmosphere. More preferably, it is carried out in a reduced pressure.

EXAMPLES

Hereinafter, the present invention will be explained in further detail through examples that are not limitative.

Film Formation Test with Printer

Example 1

(Comparative)

A glass substrate provided with ITO patterns each having a width of 2 mm was prepared by photolithography. The glass substrate with the ITO patterns was washed by a conventional wet process using isopropyl alcohol, acetone and purified water and a conventional dry process such as UV ozone treatment, plasma treatment and the like.

Then, PDF was dissolved in a solvent of o-xylene to prepare a coating liquid for forming a blue light emitting layer. A printer A (FIG. 11) or a printer B (FIG. 12) obtained by modifying a commercially available letterpress printer was placed in a thermostatic bath and a temperature for coating is set to 20° C. to transfer the coating liquid to the glass substrate with the ITO patterns. A transfer substrate of APR (Shore A: 55) was used. Printing pressure was 0.1 mm. The printer B used an anilox roll of 300 lines/inch.

A shadow mask having slits of 2 mm×100 mm that were orthogonal to the ITO patterns was fixed to the substrate. Then, the substrate was placed in a vapor deposition apparatus to deposit thereon Ca to 50 nm and Ag to 200 nm under vacuum of $1\times10^{-6}$ Torr to prepare electrodes.

Example 2

(Comparative)

An organic EL element was formed in the same manner as in Example 1 except that toluene was used in place of o-xylene.

Example 3

An organic EL element was formed in the same manner as in Example 1 except that isopropylbenzene was used in place of o-xylene.

Example 4

An organic EL element was formed in the same manner as in Example 1 except that trimethylbenzene was used in place of o-xylene.

Example 5

An organic EL element was formed in the same manner as in Example 1 except that a mixture of o-xylene and nitrobenzene in the ratio of 4:6 was used in place of o-xylene.

Example 6

An organic EL element was formed in the same manner as in Example 1 except that the temperature for coating was 0° C.

Example 7

(Comparative)

An organic EL element was formed in the same manner as in Example 1 except that a coating liquid for forming a green light emitting layer prepared by dissolving Pre-PPV in a solvent of methanol was used in place of the coating liquid for forming the blue light emitting layer.

Example 8

An organic EL element was formed in the same manner as in Example 7 except that a mixture of methanol and ethylene glycol in the ratio of 4:6 was used in place of methanol.

Example 9
(Comparative)

An organic EL element was formed in the same manner as in Example 1 except that a coating liquid for forming a red light emitting layer prepared by dissolving MEH-CN-PPV in toluene was used in place of the coating liquid for forming the blue light emitting layer.

Example 10

An organic EL element was formed in the same manner as in Example 9 except that a mixture of o-xylene and nitrobenzene in the ratio of 4:6 was used in place of toluene.

The organic EL elements prepared in Examples 1–10 were subjected to a transfer test using a microscope and a UV lamp to inspect whether the film had been formed on the substrate or not. The elements in which the film had been formed were then subjected to a light emission test by applying direct voltage. The results are shown in Table 1.

Then, a resist film of 30 μm thick. made of polyimide was formed on the substrate by spin coating. Light exposure was performed using a mask, and then a residue of the resist was washed away. Thus, first ribs each having a width of 40 μm and a pitch of 130 μm were formed in the direction parallel to the ITO electrodes.

On the substrate, a PEDOT solution was applied using a spin coater to form a hole injection layer of 100 nm thick.

Figure 15:
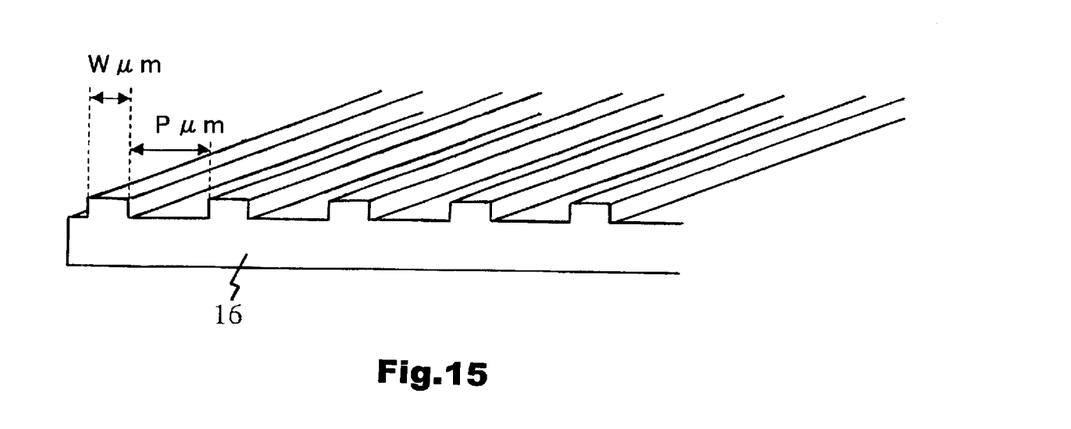
FIG. 15 is a schematic perspective view partially illustrating a patterned APR resin substrate according to an example of the present invention.

Then, a modified version of a commercially available letterpress printer (manufactured by Japan Photo Printing Co. Ltd., Japan) provided with an alignment mechanism was placed in a thermostatic bath. Temperature for coating was set to 20° C. and the atmosphere in the thermostatic bath was replaced with $N_2$. Using the coating liquids for forming the blue, green and red light emitting layers used in Examples 5, 8 and 10, respectively and a transfer substrate of APR resin patterned to have a pitch P=270 μm and a width W=120 μm as shown in FIG. 15, the transfer step was repeated while moving the substrate by 130 μm using a micrometer of X-Y

TABLE 1

|  | Solvent | Vapor pressure (Pa) | Film formation condition Temperature (° C.) | Printer A Transfer test | Printer A Light emission test | Printer B Transfer test | Printer B Light emission test |
|---|---|---|---|---|---|---|---|
| Ex. 1 | O-xylene | 700 | 20 | × | — | × | — |
| Ex. 2 | Toluene | 2900 | 20 | × | — | × | — |
| Ex. 3 | Isopropyl benzene | 430 | 20 | ○ | Δ | × | — |
| Ex. 4 | Triethyl benzene | 247 | 20 | ○ | ○ | ○ | ○ |
| Ex. 5 | O-xylene Nitrobenzene | 700 20 | 20 | ○ | ○ | ○ | ○ |
| Ex. 6 | O-xylene | 170 | 0 | ○ | ○ | ○ | ○ |
| Ex. 7 | Methanol | 12300 | 20 | × | — | × | — |
| Ex. 8 | Methanol Ethylene glycol | 12300 10 | 20 | ○ | ○ | ○ | ○ |
| Ex. 9 | Toluene | 21000 | 20 | × | — | × | — |
| Ex. 10 | O-xylene Nitrobenzene | 700 20 | 20 | ○ | ○ | ○ | ○ |

Transfer test 1) ○: Film was formed. ×: Film was not formed
Light emission test 2) ○: Uniform light emission was observed. Δ: Slight irregularity was observed in light emission.

Example 6 shows that the film was formed with a vapor pressure of 430 Pa or less. Through experiments performed with varied film formation temperatures, it was observed that the film was formed using the solvent of o-xylene at a temperature at which the vapor pressure becomes 500 Pa or less. In some cases, the film was not formed at a temperature at which the vapor pressure exceeded 500 Pa. With the vapor pressure of 600 Pa or more, the film was not formed.

Example 11

A glass substrate provided with ITO of 130 nm thick was subjected to photolithography to form ITO transparent electrodes arranged in stripes each having a width of 100 μm and a pitch of 130 μm as the first electrodes.

The glass substrate provided with the ITO electrodes was washed by a conventional wet process using isopropyl alcohol, acetone and purified water and a conventional dry process such as UV ozone treatment and plasma treatment.

stage. Thus, the blue, green and red light emitting layers each having a thickness of 100 nm were formed.

In this step, after forming the green light emitting layer with the coating liquid for forming the green light emitting layer, a thermal treatment was performed in Ar atmosphere at 150° C. for 6 hours to convert the precursor into polyphenylenevinylene. Then, after the blue and the red light emitting layers were formed, another thermal treatment was performed under reduced pressure of $1 \times 10^{-3}$ Torr at 100° C. for 1 hour.

Using a shadow mask having a thickness of 0.2 μm, a width of 310 μm and a pitch of 340 μm, Al and Li were co-deposited to form Al/Li alloy electrodes which serve as the second electrodes. Then, sealing was provided with epoxy resin.

In the thus formed organic LD (EL) display, short circuit did not occur between the first electrodes and the second electrodes, between the first electrodes themselves, and between the second electrodes themselves. Irregular light emission from the edge of the pixels due to uneven thicknesses of the light emitting layer and the charge-transporting layer was not observed. By applying a pulse voltage of 30V to the display, light emission was obtained from all pixels.

Example 12

A glass substrate provided with ITO of 130 nm thick was subjected to photolithography to form ITO transparent electrodes arranged in stripes, each having a width of 100 $\mu$m and a pitch of 130 $\mu$m.

The glass substrate provided with the ITO electrodes was washed by a conventional wet process using isopropyl alcohol, acetone and purified water and a conventional dry process such as UV ozone treatment, plasma treatment and the like.

A resist film of 2 $\mu$m thick made of photosensitive polyimide was formed on the substrate. Light exposure was carried out using a mask and then a residue of the resist was washed away to form ribs having a width of 40 $\mu$m and a pitch of 230 $\mu$m extending along the direction orthogonal to the ITO electrodes.

Then, a PEDOT solution (a mixture solution prepared by dissolving PEDOT/PSS into a mixture of purified water and ethylene glycol in the ratio of 5:5) was formed into a hole-transporting layer of 50 nm thick using a modified version of a commercially available printer (manufactured by Japan Photo Printing Co. Ltd.).

A coating liquid for forming a blue light emitting layer was prepared by dissolving PDF into a mixture of o-xylene and nitrobenzene in the ratio of 5:5. A coating liquid for forming a green light emitting layer was prepared by dissolving Pre-PPV into a mixture of methanol and ethylene glycol in the ratio of 5:5. A coating liquid for forming a red light emitting layer was prepared by dissolving MEH-CN-PPV into a mixture of o-xylene and nitrobenzene in the ratio of 5:5. Using three modified versions of commercially available printers each including an APR resin transfer substrate having projected and depressed patterns as shown in FIG. 15 (Shore A hardness: 50) and an anilox roll of 360 lines/inch, the coating liquids of three colors were transferred repeatedly to form the blue, green and red light emitting layers of 100 nm thick.

In this step, the green light emitting layer was formed first and then a thermal treatment in Ar atmosphere at 150° C. for 6 hours was performed to convert the precursor into polyphenylenevinylene. Thereafter, the blue and the red light emitting layers were formed and another thermal treatment was performed under reduced pressure of $1\times10^{-3}$ Torr at 100° C. for 1 hour to dry the obtained layers.

Next, a shadow mask having slits of 100 $\mu$m×100 mm extending orthogonally to the ITO electrodes was attached to the substrate. The substrate was placed in a vacuum deposition apparatus to deposit Ca and Ag to thicknesses of 50 nm and 200 nm, respectively under vacuum of $1\times10^{-6}$ Torr to form the second electrodes. Thereafter, sealing was provided with a UV curing resin.

Pulse voltage of 30V was applied to the thus obtained organic EL element to evaluate electrical properties thereof.

From the organic EL element, uniform emission of red, blue and green light was observed. A percentage of area shared by the light emitting region in the organic EL element was 43%. Where the second electrodes were formed narrow to prevent overlap with portions on which the organic EL layer was not formed by the printing method, light emission was observed but the percentage of the light emitting region was reduced.

Comparative Example 1

An organic EL element was formed in the same manner as in Example 12 except that a shadow mask having slits of 200 $\mu$m×100 mm was used instead of the shadow mask having slits of 100 $\mu$m×100 mm.

Pulse voltage of 30V was applied to the organic EL element to evaluate the electrical properties.

As a result, short circuit occurred between the first electrodes and the second. No light emission was observed from the organic EL element.

Where the second electrodes were formed wide to increase the percentage of the light emitting region as described above, short circuit occurred in a portion where the organic EL layer had not been formed by the printing method. Therefore light emission was not observed.

Example 13

Before forming the blue light emitting layer, a hole-transporting layer of 50 nm thick was formed by applying a PEDOT solution with a spin coater at 2000 rpm for 90 seconds. A shadow mask having slits of 200 $\mu$m×100 mm extending orthogonally to the ITO electrodes was attached to the substrate. The substrate was placed in a vacuum deposition apparatus to deposit Ca and Ag to thicknesses of 50 nm and 200 nm, respectively under vacuum of $1\times10^{-6}$ Torr to form the second electrodes. Other formation steps are the same as in Example 12.

Pulse voltage of 30V was then applied to the organic EL element to evaluate the electrical properties. A uniform light emission was obtained from the organic EL element. The percentage of area shared by the light emitting region in the organic EL element was 83%. By the combination of the printing method and the spin coating, the light emission was obtained even when the second electrodes of greater width were formed to increase the percentage.

Example 14

An organic EL element was formed in the same manner as in Example 13 except that a hole-transporting layer of 200 nm was formed by bar coating (with a bar coater of 0.1 mil, moved at 20 mm/sec) instead of the spin coating.

Pulse voltage of 30V was applied to the organic EL element to evaluate the electrical properties. Uniform light emission was obtained from the organic EL element. The percentage of area shared by the light emitting region in the organic EL element was 83%. By the combination of the printing method and the bar coating, the light emission was obtained even when the second electrodes of greater width were formed to increase the percentage.

Example 15

An organic EL element was formed in the same manner as in Example 13 except that the hole-transporting layer was formed by dip coating (with a dip coater, the substrate was pulled up at 10 mm/sec) instead of the spin coating.

Pulse voltage of 30V was applied to the organic EL element to evaluate the electrical properties. The organic EL element showed uniform light emission. The percentage of area shared by the light emitting region in the organic EL element was 83%. By the combination of the printing method and the dip coating, the light emission was obtained even when the second electrodes of greater width were formed to increase the percentage.

Example 16

An organic EL element was formed in the same manner as in Example 13 except that a poly-OXD solution was applied on the blue, green and red light emitting layers using a spin coater at 3000 rpm for 90 seconds to form a charge-transporting layer of 50 nm thick. Pulse voltage of 30V was applied to the organic EL element to evaluate the electrical properties. Uniform emission of blue, red and green light was observed. The percentage of area shared by the light emitting region in the organic EL element was 83%. By the combination of the printing method and the spin coating, the light emission was obtained even when the second electrodes of greater width were formed to increase the percentage.

Example 17

An organic EL element was formed in the same manner as in Example 12 except that a poly-OXD solution was applied by discharge coating with an extrusion coater to form a charge-transporting layer of 100 nm thick.

Pulse voltage of 30V was applied to the organic EL element to evaluate the electrical properties. Uniform emission of red, green and blue light was observed. The percentage of area shared by the light emitting region in the organic EL element was 83%. By the combination of the printing method and the discharge coating, the light emission was obtained even when the second electrodes of greater width were formed to increase the percentage.

Example 18

An organic EL element was formed in the same manner as in Example 12 except that $Alq_3$ was evaporated at an evaporation rate of 2 Å/sec onto the blue, green and red light emitting layers to form a charge-transporting layer of 50 nm thick. Pulse voltage of 30V was applied to the organic EL element to evaluate the electrical properties. Uniform emission of red, green and blue light was observed. The percentage of area shared by the light emitting region in the organic EL element was 83%. By the combination of the printing method and the vapor deposition, the light emission was obtained even when the second electrodes of greater width were formed to increase the percentage.

Example 19

On a glass substrate, TFTs were formed and then ITO transparent electrodes of 200 μm length×100 μm width which serve as the first electrodes were formed. Then, ribs of a positive resist each having a width of 40 μm, a thickness of 3 μm and a trapezoidal cross section were formed between the pixels by a photoresist technique. Thereafter, the hole-transporting layer, the blue, green and red light emitting layers were formed in the same manner as in Example 16.

The substrate was then placed in a vacuum deposition apparatus to evaporate Ca and Ag to thicknesses of 50 nm and 200 nm, respectively under vacuum of $1\times10^{-6}$ Torr to form the second electrodes. Subsequently, sealing was provided with a UV curing resin.

Voltage of 5V was applied to the organic EL element to evaluate the electrical properties. Uniform emission of red, green and blue light was obtained from the organic EL element.

According to the present invention, the coating liquid can be transferred onto the substrate with great efficiency so that the organic EL layer of 1 μm or less can be uniformly formed. As a result, the organic EL element and the organic EL display allowing excellent color display can be formed with less production costs.

Still according to the present invention, a uniformly patterned thin organic layer can easily be formed by the letterpress printing. It is also possible to prevent short circuit, which occurs between the electrodes when the organic layer was formed by other printing methods, without reducing the percentage of area shared by the light emitting region. Moreover, irregularity on the film formed by the printing was prevented so that uniform light emission can be obtained. Therefore, a patterned organic EL element can be formed with less production costs.

What is claimed is:

1. A coating liquid for forming an organic light emitting layer of an organic El element by a printing method, the liquid comprising:
   at least one organic solvent having a vapor pressure of 500 Pa or less at a temperature for forming the organic light emitting layer.

2. A coating liquid according to claim 1, wherein the solvent showing the vapor pressure of 500 Pa or less is a mixed solvent containing 50wt % or more of an organic solvent having the vapor pressure of 500 Pa or less.

3. A coating liquid according to claim 1, wherein the vapor pressure of the organic solvent is 250 Pa or less.

4. A coating liquid according to claim 1, wherein the organic solvent is diethylbenzene, trimethylbenzene, triethylbenzene, isopropylbenzene or nitrobenzene.

5. A coating liquid according to claim 1, wherein the organic solvent is a mixture of xylene and nitrobenzene in the ration of 4:6 or a mixture of methanol and ethylene glycol in the ratio of 4:6.

6. A coating liquid according to claim 1, wherein the temperature for forming the organic layer is 0° C. to 30° C.

7. A coating liquid for forming an organic light emitting layer of an organic EL element, the liquid comprising:
   a light emitting material provided in at least one organic solvent, where the solvent has a vapor pressure of 500 Pa or less at a temperature for forming the organic light emitting layer.

8. The coating liquid of claim 7, wherein the temperature for forming the organic light emitting layer is from 0–30 degrees C.

9. The coating liquid of claim 7, wherein the light emitting material in the liquid comprises a light emitting polymer material.

10. A coating liquid for forming a charge-transporting layer of an organic EL element, the liquid comprising:
    a charge transporting material comprising a polymer material provided in at least one organic solvent, where the solvent has a vapor pressure of 500 Pa or less at a temperature for forming the charge transporting layer, wherein the temperature for forming the charge transporting layer is from 0–30 degrees C.

* * * * *